(12) United States Patent
Chamberlin et al.

(10) Patent No.: US 7,620,508 B2
(45) Date of Patent: Nov. 17, 2009

(54) TERAHERTZ DETECTION USING A MULTI-MODE SIGNAL

(75) Inventors: Danielle R. Chamberlin, Belmont, CA (US); Peter R. Robrish, San Francisco, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 658 days.

(21) Appl. No.: 11/044,754

(22) Filed: Jan. 27, 2005

(65) Prior Publication Data

US 2006/0167641 A1     Jul. 27, 2006

(51) Int. Cl.
    *G06F 3/00*     (2006.01)

(52) U.S. Cl. .............................. 702/75; 702/66; 702/71; 702/76

(58) Field of Classification Search .................. 702/75, 702/134, 159, 19, 179, 181, 182, 183, 186; 324/644, 334; 356/432, 445; 342/13, 174; 250/330
    See application file for complete search history.

(56) References Cited

U.S. PATENT DOCUMENTS

| | | | | |
|---|---|---|---|---|
| 6,057,928 A * | 5/2000 | Li et al. | ....................... | 356/445 |
| 6,324,191 B1 * | 11/2001 | Horvath | ....................... | 372/19 |
| 6,370,219 B1 * | 4/2002 | Peale | ....................... | 378/28 |
| 6,388,799 B1 * | 5/2002 | Arnone et al. | ............... | 359/326 |
| 6,693,848 B1 * | 2/2004 | Ambs et al. | .................. | 367/149 |
| 6,734,974 B2 * | 5/2004 | Jiang et al. | .................... | 356/432 |
| 6,853,456 B2 * | 2/2005 | Mells | .......................... | 356/484 |
| 6,864,825 B2 * | 3/2005 | Holly | .......................... | 342/13 |
| 7,152,007 B2 * | 12/2006 | Arnone et al. | ................. | 702/75 |
| 7,298,317 B2 * | 11/2007 | Charpentier et al. | ........ | 342/174 |
| 2004/0155665 A1 | 8/2004 | Arnone et al. | | |

OTHER PUBLICATIONS

Shiquan, Y., Tunable Dual-Wavelength Actively Mode-Locked Fiber Laser with an F-P Semiconductor Modulator, Nov. 2002, IEEE Photonics Technology Letters/ vol. 14, No. 11, 1494-1946.*
Barbieri, S., Heterodyne mixing of two far-infrared quantum cascade lasers by use of a point-contact Schottky diode, Optics Letters/ vol. 29, No. 14/ Jul. 15, 2004.
Siegel, Peter H., Terahertz Technology, IEEE Transactions on Microwave Theory and Techniques, vol. 50, No. 3, Mar. 2002.

* cited by examiner

*Primary Examiner*—Eliseo Ramos Feliciano
*Assistant Examiner*—Felix E Suarez

(57) ABSTRACT

A technique for generating and detecting an EM signal in the THz range involves generating EM energy having multiple modes, selecting at least two of the modes of the EM energy to provide a multi-mode EM signal, subjecting the multi-mode EM signal to mixing, and isolating a beat signal component that results from the mixing. The spacing between adjacent ones of the selected modes, i.e., the frequency difference between the modes, is in the radio frequency (RF) or microwave frequency ranges. Signals in these ranges are commonly processed using electronic circuits at room temperature.

19 Claims, 5 Drawing Sheets

TERAHERTZ DETECTION USING A MULTI-MODE SIGNAL

BACKGROUND OF THE INVENTION

Electromagnetic (EM) signals in the terahertz (THz) range are being explored for use in imaging applications. For example, EM signals in the THz range may be used to image materials that are opaque at optical frequencies and that provide very low contrast to x-rays. Some applications of THz imaging may include security screening and manufacturing quality control.

EM signals in the THz range used for imaging can be detected using direct or heterodyne-based detection techniques. Direct detection techniques provide limited sensitivity or require cryogenic cooling of the detector electronics. Known heterodyne-based detection techniques provide high sensitivity detection at room temperature using electronic circuits by mixing two EM signals of different frequency from two different signal sources to produce a heterodyne beat signal. The mixing of the two EM signals from the two different sources requires precise alignment of optical elements to ensure that the two EM signals are incident on the same spot on the receiving mixer. The area on which the two EM signals must coincide on the receiving mixer is extremely small and therefore the alignment process can require specialized alignment equipment and can be quite time consuming.

In view of this, what is needed is a technique for detecting EM signals in the THz range that can be performed using electronic circuits at room temperature with reduced alignment requirements.

SUMMARY OF THE INVENTION

A technique for generating and detecting an EM signal in the THz range involves generating EM energy having multiple modes, selecting at least two of the modes of the EM energy to provide a multi-mode EM signal, subjecting the multi-mode EM signal to mixing, and isolating a beat signal component that results from the mixing. The spacing between adjacent ones of the selected modes, i.e., the frequency difference between the modes, is in the radio frequency (RF) or microwave frequency ranges. Signals in these ranges are commonly processed using electronic circuits at room temperature.

An advantage of this technique over direct detection is that heterodyne-based detection provides higher sensitivity than direct detection without the need for cryogenic cooling. An advantage of this technique over other heterodyne-based detection systems that mix two different EM signals from two different sources is that the multi-mode EM signal is generated from a single source and therefore does not require precise alignment to ensure proper mixing. Further, the technique requires only one EM source, thus eliminating the need for a second source such as a local oscillator source.

An additional advantage of this technique is that selecting modes from EM energy having multiple modes before mixing allows for the mixing of only a few modes of an EM signal without the decrease in output power that would typically be necessary to initially produce an EM signal with only a few modes. This enables the use of a strong EM signal in an application such as THz imaging.

Other aspects and advantages of the present invention will become apparent from the following detailed description, taken in conjunction with the accompanying drawings, illustrating by way of example the principles of the invention.

BRIEF DESCRIPTION OF THE DRAWINGS

Throughout the description similar reference numbers are used to identify similar elements.

DETAILED DESCRIPTION

A technique for generating and detecting an EM signal in the THz range involves generating EM energy having multiple modes, selecting at least two of the modes of the EM energy to provide a multi-mode EM signal, subjecting the multi-mode EM signal to mixing, and isolating a beat signal component that results from the mixing. The spacing between adjacent ones of the selected modes, i.e., the frequency difference between the modes, is in the radio frequency (RF) or microwave frequency ranges. Signals in these ranges are commonly processed using electronic circuits at room temperature.

Figure 1:
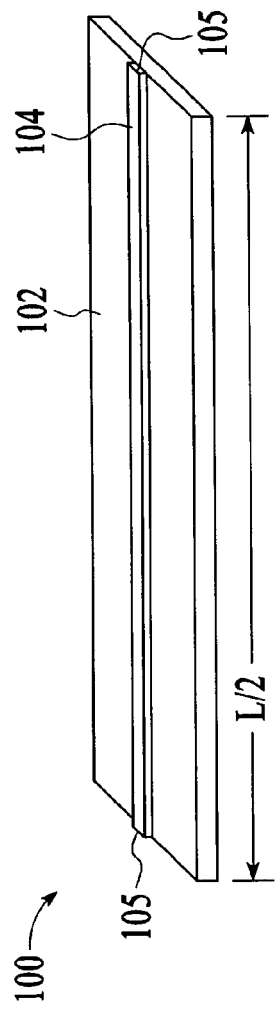
FIG. 1 depicts an exemplary source of an EM signal in the THz range.

FIG. 1 depicts an exemplary source 100 of EM energy having multiple modes in the THz range. In the example of FIG. 1, the source is a quantum cascade (QC) laser with a typical semiconductor "ridge waveguide" structure. The QC laser includes a substrate 102 and an active laser medium 104. In this case, the resonant cavity of the laser is defined by cleaved facets 105 at the edges of the active laser medium. The roundtrip length of the resonant cavity is identified as "L" and in the configuration of FIG. 1 the length dimension of the QC laser is L/2. As is well-known in the field, for the case where the active laser medium geometry defines the resonant cavity, the resonant cavity roundtrip length, L, influences the absolute gain and the mode spacing of the laser. Throughout the description, the THz range is defined as the range of approximately 0.1 THz to 10 THz.

Figure 2B:
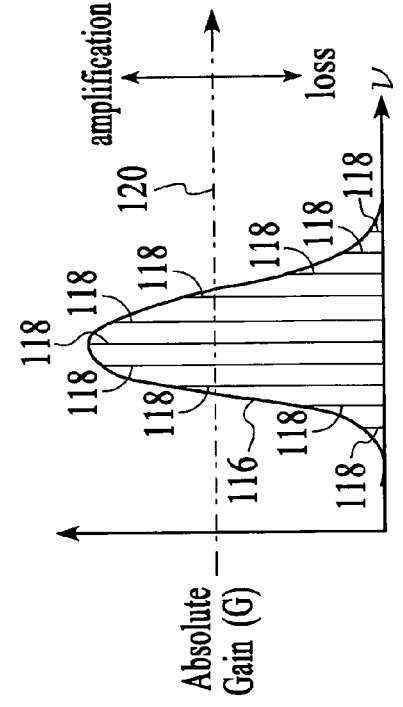
FIG. 2B depicts an absolute gain spectrum of a source with a longer resonant cavity roundtrip length.
Figure 2A:
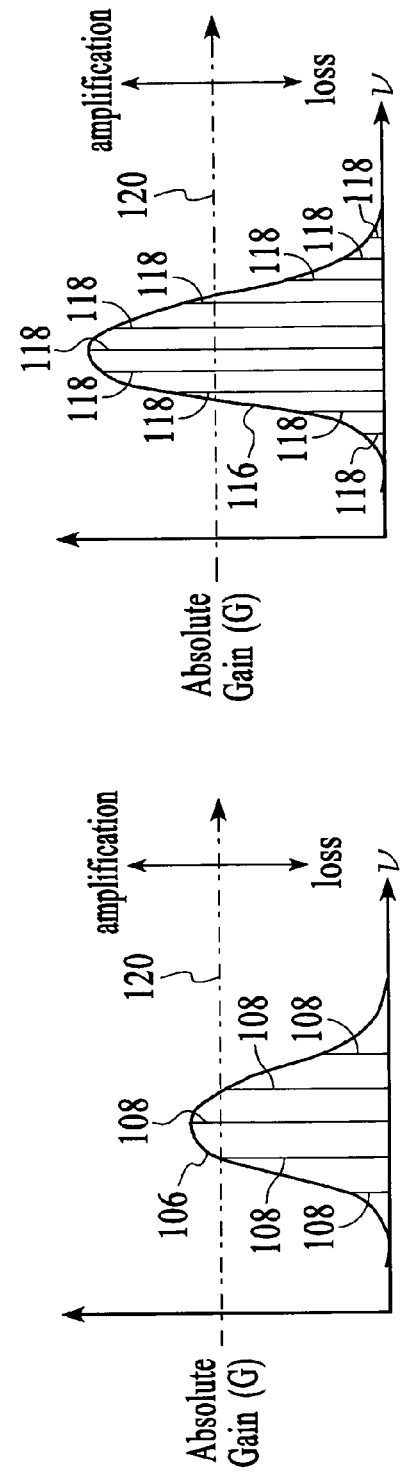
FIG. 2A depicts an absolute gain spectrum of a source with a shorter resonant cavity roundtrip length.

The absolute gain G of the source 100 for a mode of the EM energy is given by: $G = gL - \alpha L - F$, where g is the gain (in cm$^{-1}$) of the active laser medium at the mode frequency, $\alpha$ (in cm$^{-1}$)

is the absorption of the active laser medium at the mode frequency, and F is a term accounting for the signal loss due to imperfect reflection and light outcoupling at the laser facets. When G>0, amplification occurs. The gain g is proportional to the pump power. When the pump power increases such that for a certain mode gL>αL−F, that mode has a sustained oscillation in the cavity and lasing occurs. FIG. 2A depicts an absolute gain spectrum of a laser with a shorter resonant cavity roundtrip length. FIG. 2B depicts that of a laser with a longer resonant cavity roundtrip length. As depicted in FIGS. 2A and 2B, the laser with the shorter resonant cavity roundtrip length has a lower absolute gain and produces EM energy 106 with fewer modes 108 at wider spacing and the laser with the longer resonant cavity roundtrip length has a higher absolute gain and produces EM energy 116 with more modes 118 at narrower spacing (assuming equivalent operating conditions). In general, as the resonant cavity roundtrip length of a laser decreases, the number of modes decreases until single mode operation is reached. For the case of the QC laser, when the resonant cavity roundtrip length is less than a certain length, the absolute gain drops below the lasing threshold (which is identified in FIGS. 2A and 2B by dashed line 120) and no lasing is observed. The spectral relationship between mode spacing and resonant cavity roundtrip length of a laser is given by:

$$\Delta v = \frac{c}{nL}$$

where $\Delta v$ is the mode spacing in radians, c is the speed of light, n is the refractive index of the active laser medium, and L is the resonant cavity roundtrip length. Given this relationship, as L is decreased, fewer modes fit within the gain bandwidth of the laser. In THz imaging applications, it is generally desirable to have an EM signal with higher absolute gain to produce an output with a good signal-to-noise ratio.

In accordance with the invention, EM energy having multiple modes in the THz range is generated, at least two modes of the EM energy are selected to provide a multi-mode EM signal, the multi-mode EM signal is subjected to mixing, and a beat signal component that results from the mixing is isolated. The spacing between adjacent ones of the selected modes, i.e., the frequency difference between the modes, is in the radio frequency (RF) or microwave frequency ranges, where the RF range is defined as 3 kHz to 300 MHz and the microwave range is defined as 300 MHz to 300 GHz. Signals in these ranges are commonly processed using electronic circuits at room temperature. Because the source is driven to generate EM energy having multiple modes, of which a few are selected for mixing, the source can be driven to a higher absolute gain than would be possible if the source was limited to producing only two modes for mixing. The resulting stronger signal is the selected modes is a desirable attribute of an EM signal used in THz imaging.

Figure 3:
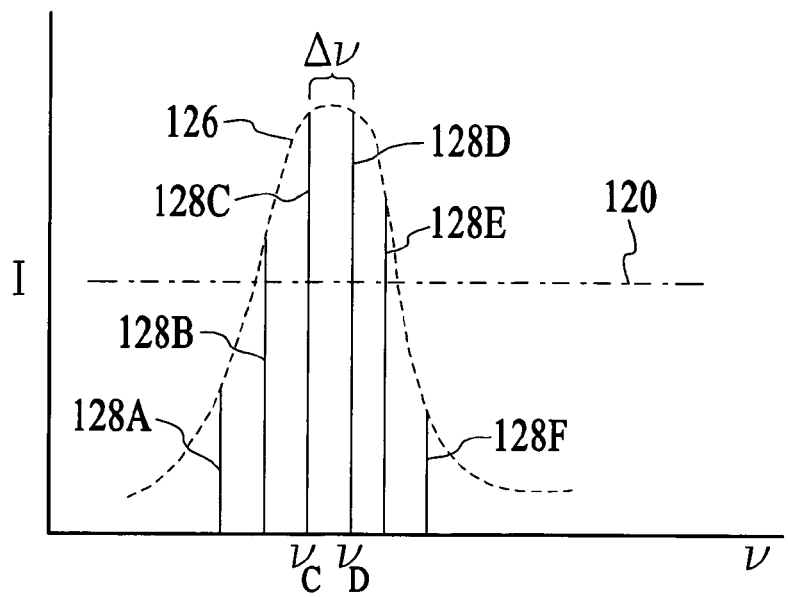
FIG. 3 depicts an intensity vs. optical frequency graph of an EM signal that has multiple modes, two of which are selected for mixing in accordance with an embodiment of the invention.

FIG. 3 depicts an intensity vs. frequency graph of EM energy 126 generated by a source having a gain profile that supports multiple modes, where the modes are identified by lines 128A-128F. In accordance with the invention, at least two of the modes are selected to provide a multi-mode EM signal for mixing. In the example of FIG. 3, two modes, 128C and 128D, are the selected modes for mixing, with mode 128C being at $v_C$ and mode 128D being at $v_D$. The two selected modes are separated in frequency by $\Delta v$, where $\Delta v$ is in a range that can be processed using electronic circuits at room temperature. Additionally, the selected modes should be narrow enough in frequency that there is little overlap between modes. Although two modes of the EM energy are selected for description purposes, more than two modes of the EM energy can be selected and mixed as described below.

Figure 4:
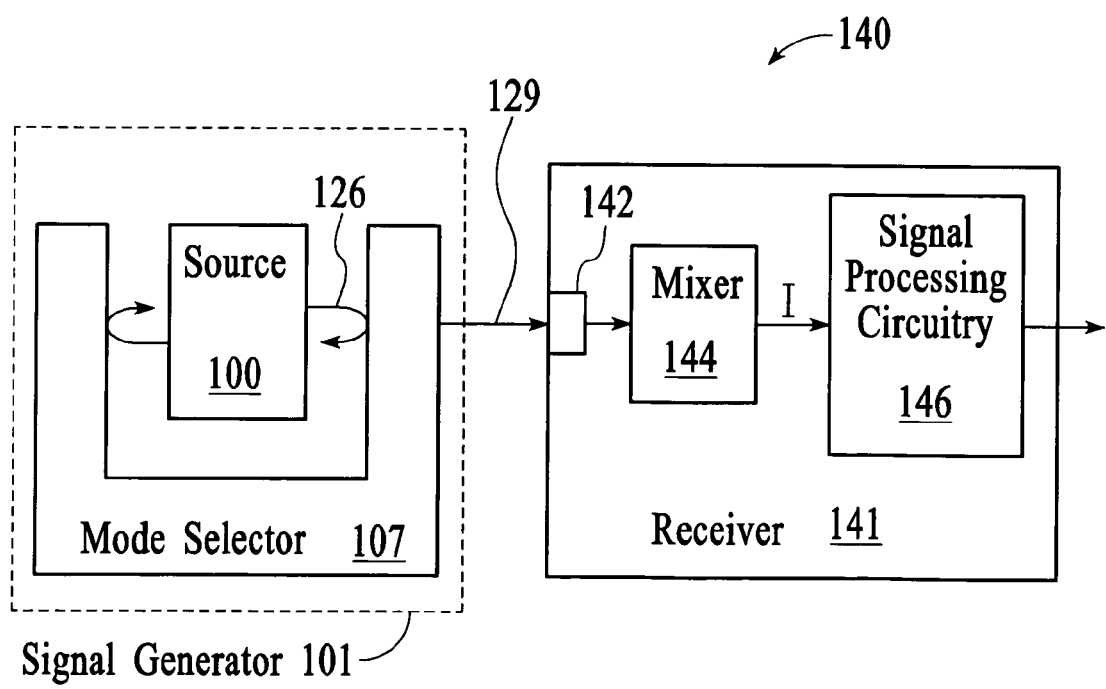
FIG. 4 depicts a detection system, in accordance with an embodiment of the invention, which includes a source that generates a multi-mode EM signal and a mode selector that selects at least two of the modes before mixing.

FIG. 4 depicts a system 140 that is configured for heterodyne detection of a multi-mode EM signal in the THz range, where the multi-mode EM signal has at least two modes with the desired mode spacing. The system includes a signal generator 101 and a receiver 141. The signal generator includes a source 100 and a mode selector 107. The signal generator may also include any equipment necessary for operation of the THz source, such as power sources, vacuum systems, cooling, or other electronic or non-electronic equipment that enables operation of the source. The source is configured and operated to generate EM energy having multiple modes in the THz range 126. The mode selector is configured to select two of the modes (e.g., modes 128C and 128D from FIG. 3) to provide a multi-mode EM signal 129 for mixing. In an embodiment, the mode selector is an external cavity that selects two of the multiple modes that the source is capable of generating. Such an external cavity has a controlled resonant cavity length that allows only the desired modes to be output to the receiver. The mode selector allows for the output of a multi-mode EM signal having only a few modes of the EM energy without the decrease in signal power that would result from decreasing the active medium path length so that the source would produce EM energy with only two modes.

Figure 5:
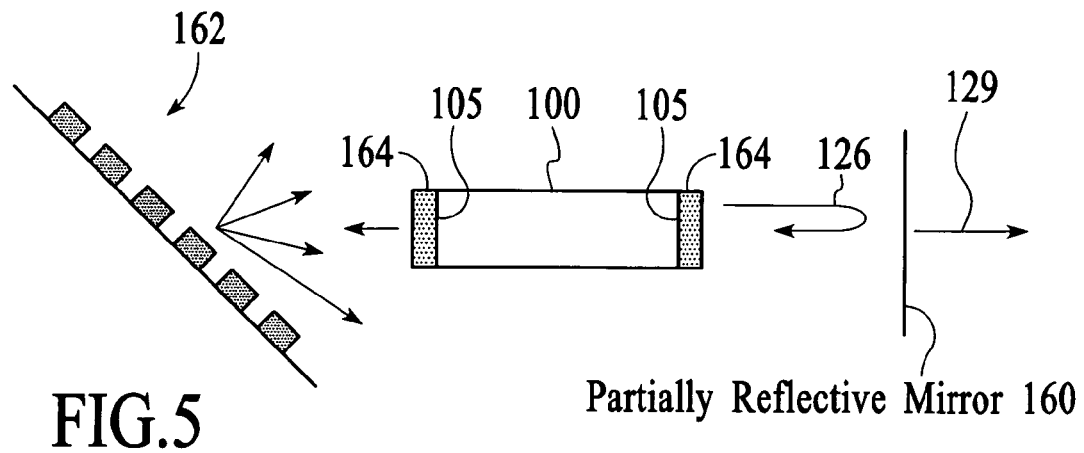
FIG. 5 depicts an embodiment of the mode selector from FIG. 4.

One example of the mode selector 107 is shown in FIG. 5. In the example of FIG. 5, the source 100 (i.e., an active laser medium) is placed between a partially reflective mirror 160 and a reflective grating 162. The cleaved facets 105 of the source are either cut at the Brewster's angle or coated with an anti-reflection coating 164 in order to remove the optical cavity defined by the cleaved facets. The partially reflective mirror has less than 100% reflectivity in order to output a portion of the EM energy 126 and the grating is configured to reflect selected modes of the laser output back toward the source. In the embodiment of FIG. 5, the grating is placed at the Littrow angle of the modes that are selected. Mode selection results from the angular dispersion of the grating. Specifically, modes outside of the wavelength range of the selected modes are dispersed out of the cavity and therefore, only the selected modes (e.g., modes 128C and 128D from FIG. 3) receive further amplification. The selected modes of the EM energy are output through the partially reflective mirror as a multi-mode EM signal 129. In this embodiment, tuning can be achieved by changing the angle of the grating to select different modes.

Figure 6:
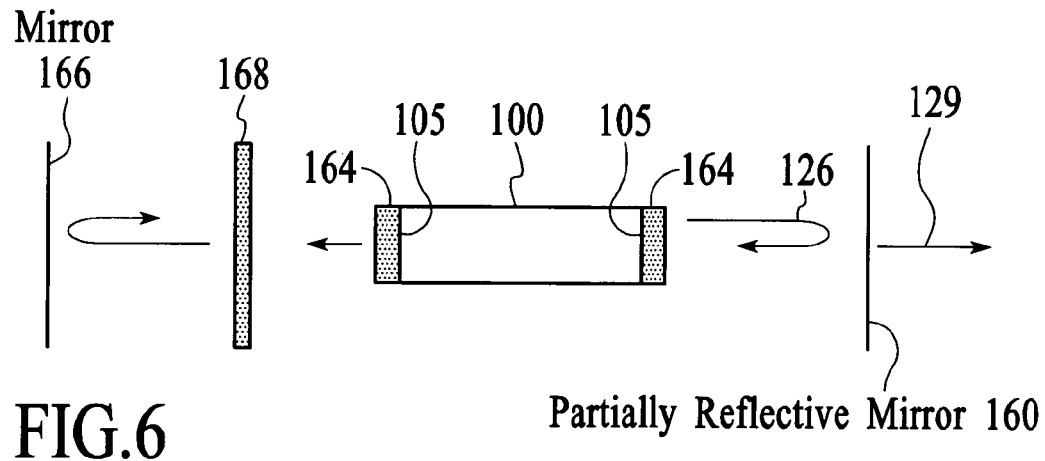
FIG. 6 depicts another embodiment of the mode selector from FIG. 4.

Another example of the mode selector 107 is shown in FIG. 6. In the example of FIG. 6, the source 100 (i.e., an active laser medium) is placed between a mirror 166 and a partially reflective mirror 160. Again, the cleaved facets 105 of the source are either cut at the Brewster's angle or coated with an anti-reflection coating 164 in order to remove the optical cavity defined by the cleaved facets. The partially reflective mirror enables the output of a portion of the EM energy 126. A filter 168 is placed within the optical path defined by the two mirrors. The filter allows only a selected few modes (e.g., modes 128C and 128D from FIG. 3) of the EM energy to pass. The selected modes that pass through the filter are amplified by the source 100. Portions of the amplified modes are output through the partially reflective mirror as a multi-mode EM signal 129. The filter may be, for example, an etalon. When using an etalon, the dielectric constant of the etalon is in the range such that the reflections from the surfaces of the etalon are sufficient to cause enough destructive interference outside the selected wavelength ranges to lower the intensity of those modes below the gain threshold. Some examples of materials that can be used are Ge (36% reflectivity) and Si (30% reflectivity), although there are many more such materials that could be used. Alternatively, the etalon may be made of several materials, such as a low-reflectivity, highly transparent material with a highly reflective coating on the surfaces. Limited tuning may be achieved in this embodiment by tilting the etalon to change the optical path length. However, the angle allowed will be limited by the "walk-off" of the beam in the etalon material, decreasing the amount of interference that takes place. In another embodiment, the filter may be placed directly against one of the cleaved facets or coat the cleaved facet.

Figure 7:
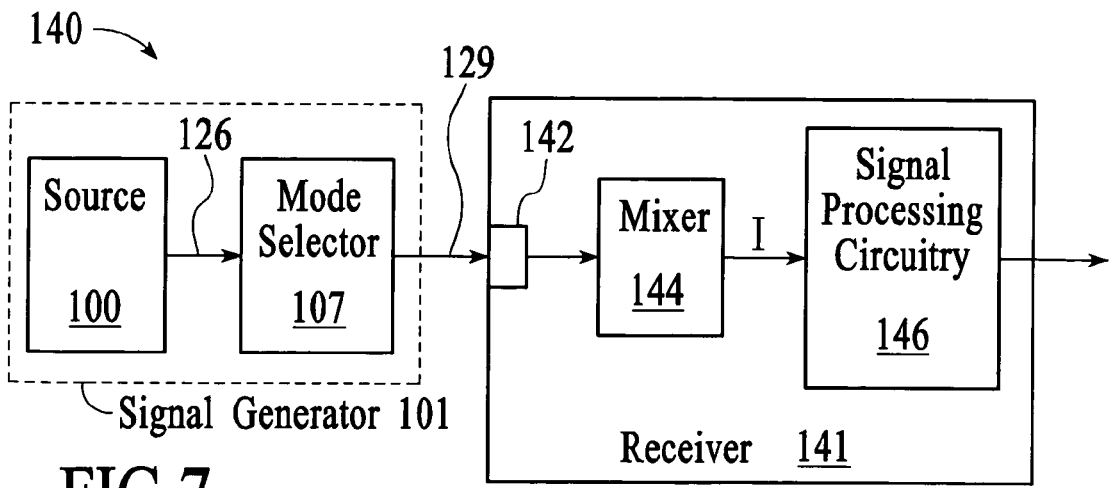
FIG. 7 depicts a mode selector in series with the source.

Although two examples of the mode selector 107 are described with reference to FIGS. 5 and 6, many other configurations are possible. Further, the mode selector may be separate from the source 100. For example, FIG. 7 depicts the mode selector in series with the source. The exact configuration of the mode selector and the particular type of mode selection is not critical to the invention.

Referring back to FIG. 4, the receiver 141 includes an input 142, a mixer 144, and signal processing circuitry 146. The input of the receiver is configured to receive the multi-mode EM signal 129 having the selected two modes (e.g., modes 128C and 128D from FIG. 3). The input may include optical and/or mechanical elements configured to position and focus the multi-mode EM signal on the mixer. The optical elements may include reflective and refractive optics made from materials that are suitably transparent to THz radiation such as silicon, germanium, polyethylene, picarin, or TPX (poly 4 methyl pentene-1). Because the mixer mixes modes from the same EM signal, alignment of the input relative to the mixer is less critical than it is when two separate EM signals are to be mixed. The input may be configured to receive the multi-mode EM signal directly from the signal generator 101 as shown in FIG. 4 or indirectly from the signal generator as described in more detail below with reference to FIGS. 9 and 10. When used in imaging applications, the receiver 141 receives the multi-mode EM signal indirectly from the signal generator after the multi-mode EM signal has passed through or reflected off of an intermediate object (e.g., an object that is to be imaged).

The mixer 144 of the receiver 141 is in signal communication with the input 142. The mixer is configured to non-linearly mix the multi-mode EM signal 129, which includes the selected two modes (e.g., modes 128C and 128D from FIG. 3), and to generate a mixer output signal in response. The mixer output signal includes a beat signal (as either voltage or current) that results from mixing the two modes. The mixer output signal is in the RF or microwave range and includes components at frequencies other than the beat frequency due to noise. The mixer output signal may be a current or a voltage. Given a multi-mode EM signal that consists of two selected modes 128C and 128D as depicted in FIG. 3., the electric field amplitude of mode 128C can be expressed as $E_C \cos(\omega_C t + \phi)$ and the electric field amplitude of mode 128D can be expressed as $E_D \cos(\omega_D t)$. Assuming non-linear mixing of the two modes of the multi-mode EM signal, the current, I, output from the mixer has a component expressed as:

$$I \propto E_C E_D \cos((\omega_C - \omega_D)t + \phi)$$

That is, the mixer output signal output from the mixer has a beat signal component having an amplitude that is proportional to the product of the amplitudes of the two modes and that oscillates at a frequency equal to the frequency difference of the two modes. The beat signal component is commonly referred to in the field using various terms such as the beat frequency, the intermediate signal, the intermediate frequency, or the down-converted signal. Suitable elements for the mixer include, but are not limited to, a gallium arsenide (GaAs) Schottky diode, a hot electron bolometer, and a semiconductor-insulator-semiconductor (SIS) mixer. GaAs Schottky diodes can operate at room temperature and therefore are especially suitable for THz detection. Again, because only a single EM signal is detected by the mixer, the issues related to aligning two different EM signals to coincide on the same spot on the mixer do not exist.

The signal processing circuitry 146 of the receiver 141 is in signal communication with the mixer 144. The signal processing circuitry is configured to isolate the beat signal component of the mixer output signal. The beat signal component is isolated so that the absolute amplitude or change in amplitude of the beat signal component can be determined. The amplitude of the beat signal component is determined because it is proportional to the product of the amplitudes of the two modes of the multi-mode EM signal 129 and therefore allows for measurement of the multi-mode EM signal. In addition to the amplitude of the beat signal component, it may be desirable to determine the absolute phase or change in phase of the beat signal component. Being able to measure the amplitude and phase of an EM signal in the THz range is important to the development of THz applications.

Figure 8:
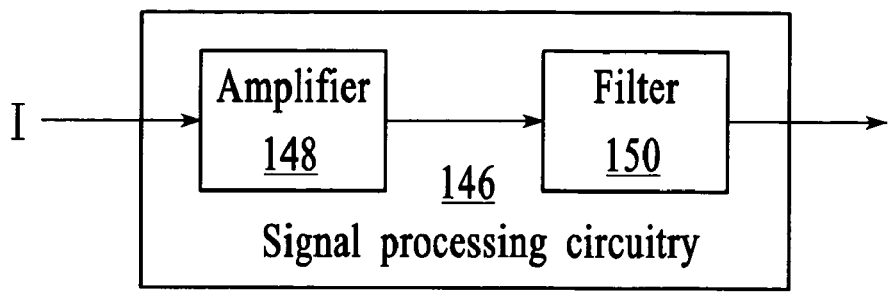
FIG. 8 depicts an example embodiment of the signal processing circuitry from FIG. 4 that includes an amplifier and a filter.

Both the amplitude and phase of the beat signal component can be determined using known RF or microwave electronics given that the frequency of the beat signal component is within the RF or microwave range as described above. In an embodiment, signal processing performed by the signal processing circuitry 146 may include amplification and filtering. FIG. 8 depicts an exemplary embodiment of the signal processing circuitry from FIG. 4 that includes an amplifier 148 and a filter 150. The amplifier and filter work in tandem to improve the signal-to-noise ratio of the beat signal component. Specifically, the amplifier increases the amplitude of the beat signal component while the filter removes noise that exists outside the frequency band of the beat signal component. The noise may be thermal noise, shot noise, signals detected from the ambient environment, or other types of noise. Although only an amplifier and filter are shown, the signal processing circuitry may include other circuitry as is known in the field to isolate the beat signal component. The processed signal output from the signal processing circuitry represents the amplitude and/or phase of the beat signal component. The processed signal may be output as a voltage or current and may be analog or digital. The exact form of the processed signal and the particular type of processing used to isolate the beat signal component is not critical to the invention.

Although one configuration of the signal processing circuitry 146 is described with reference to FIG. 8, many other configurations are possible. One alternative configuration includes a band pass filter tuned to the frequency of the beat signal component and a power and/or phase meter. Another alternative configuration includes a second mixer with a local oscillator tuned to a frequency that differs from the beat signal component by an intermediate frequency.

Figure 9:
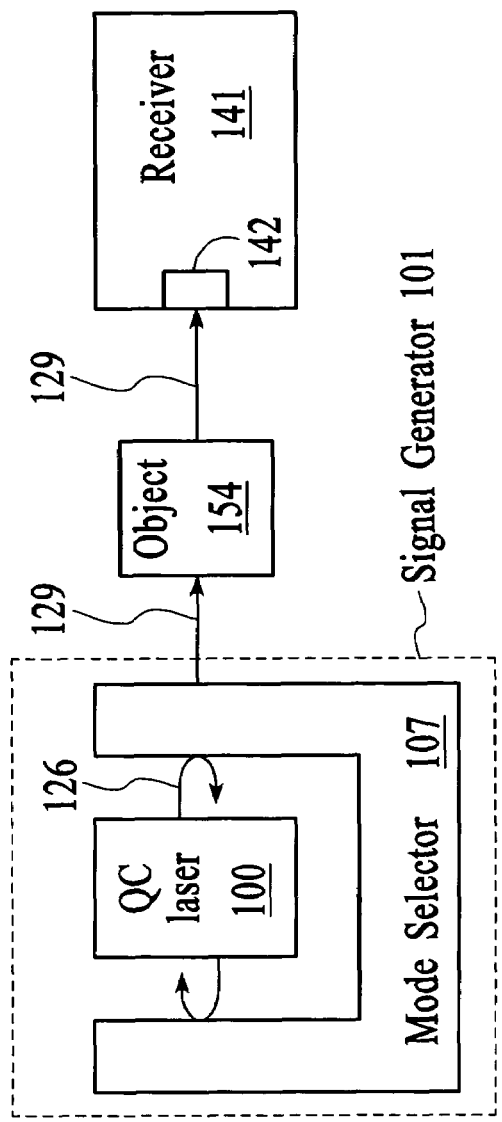
FIG. 9 depicts an example of a configuration in which the selected modes of an EM signal pass through an object before being mixed.
Figure 10:
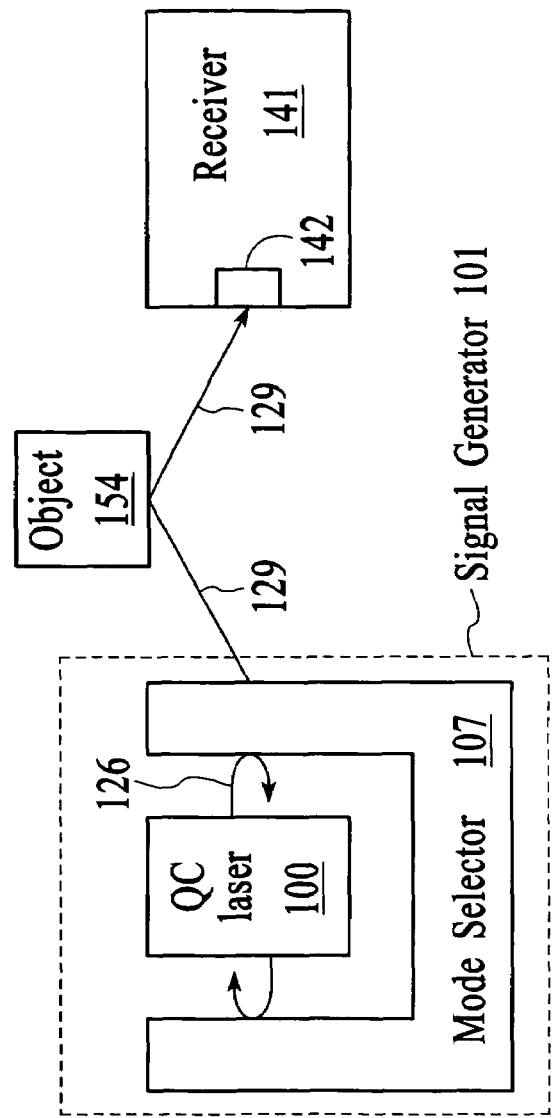
FIG. 10 depicts another example of a configuration in which the selected modes of an EM signal reflect off an object before being mixed.

To image an object, EM energy is applied to various locations on the object and then the amplitude of the portion of the applied EM energy returned from the object is measured. Imaging of an object can be achieved by scanning EM energy over the object and measuring the amplitude of the portion of the scanned EM energy returned by the object or by applying EM energy broadly to the object and scanning detection of the returned EM energy over the object. When used in THz imaging applications, the multi-mode EM signal in the THz range is indirectly provided to the input 142 of the receiver 141 after interacting with an object instead of being directly provided to the receiver as depicted in FIGS. 4 and 7. FIG. 9 depicts an example of a configuration in which the signal generator 101 is indirectly connected to the receiver. In the configuration of FIG. 9, the portion of the multi-mode EM signal 129 returned by an object 154 passes through the object 154 before being received at the receiver. FIG. 10 depicts another example of a configuration in which the signal generator is indirectly connected to the input of the receiver. In the configuration of FIG. 10, the portion of the multi-mode EM signal 129 returned by an object 154 reflects off the object 154 before being received at the receiver. Although some exemplary configurations are described herein with reference to FIGS. 4, 7, 9, and 10, other configurations of signal transmissions between the signal generator and the receiver are possible.

Referring back to FIGS. 3 and 4, operation of the system 140 begins by applying enough power to the source 100 to generate EM energy 126 in the THz range that has multiple modes, e.g., modes 128A-128F. The EM energy is subjected to the mode selector 107 and a multi-mode EM signal 129 having two modes (e.g., modes 128C and 128D from FIG. 3) is selected. The two modes of the multi-mode EM signal have a frequency difference in the RF or microwave range. The two modes of the multi-mode EM signal are then provided to the input of the receiver and then to the mixer 144. The mixer mixes the two modes of the multi-mode EM signal and generates a mixer output signal that includes a beat signal component. The mixer output signal is provided to the signal processing circuitry 146 for signal processing. The signal processing circuitry isolates the beat signal component that results from the mixing of the selected two modes. The beat signal component is then used to measure the multi-mode EM signal. In imaging applications, the multi-mode EM signal is measured after it has interacted with the object that is to be imaged.

In an embodiment, the detection technique may involve an on-to-off comparison, sometimes referred to as "chopping". The on-to-off comparison is achieved by rapidly turning the source on and off at a known frequency or otherwise intermittently providing the multi-mode EM signal to the receiver. The receiver may then "lock-in" to the known chopping frequency to provide increased sensitivity.

Figure 11:
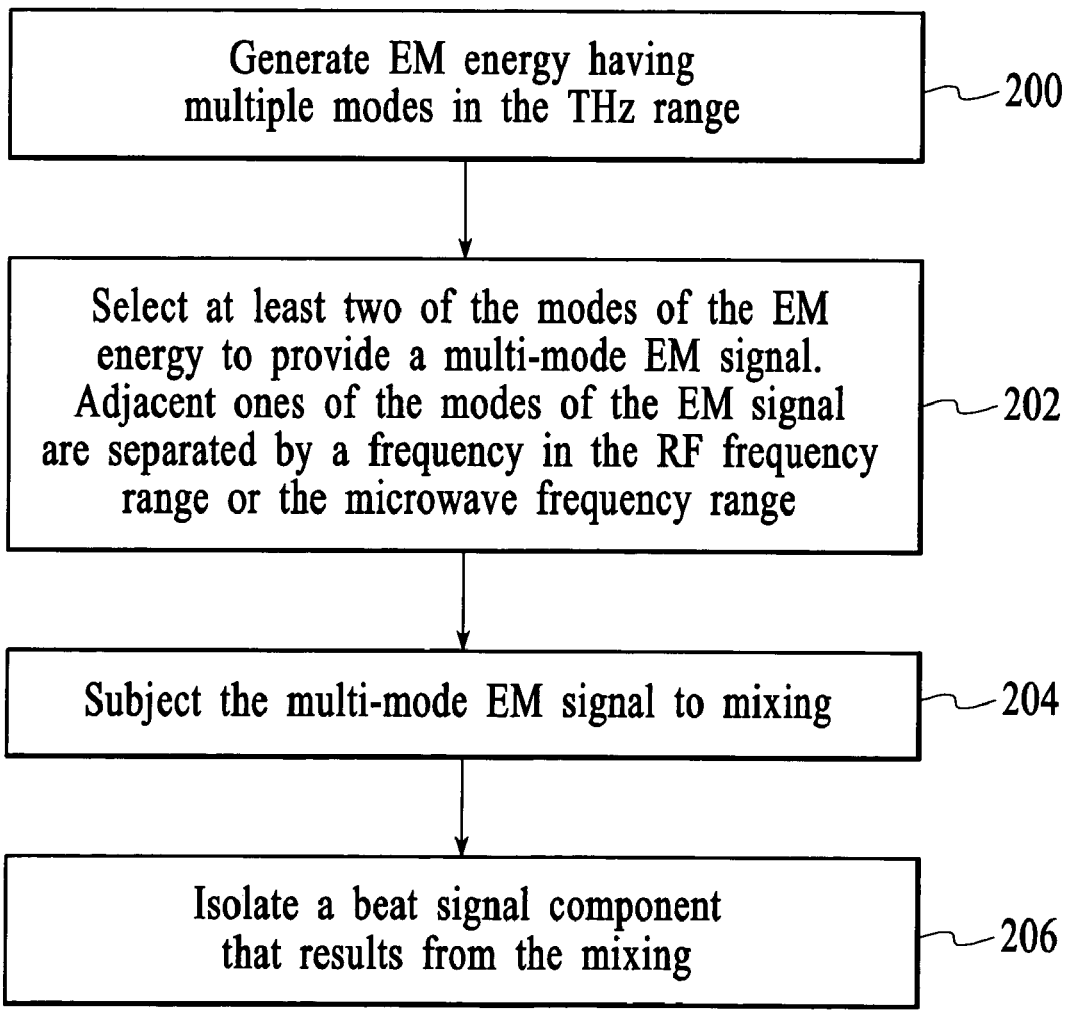
FIG. 11 is a process flow diagram of a method for generating and detecting an EM signal in the THz range in accordance with an embodiment of the invention.

FIG. 11 is a process flow diagram of a method for generating and detecting an EM signal in the THz range in accordance with an embodiment of the invention. At block 200, EM energy having multiple modes in the THz range is generated. At block 202, at least two of the modes of the EM energy are selected to provide a multi-mode EM signal. Adjacent ones of the modes of the EM signal are separated by a frequency in the RF frequency range or the microwave frequency range. At block 204, the multi-mode EM signal is subjected to mixing. At block, 206, a beat signal component that results from the mixing is isolated.

The example described with reference to FIGS. 3 and 4 involves the case in which only two modes 128C and 128D of the EM energy 126 are selected to provide the multi-mode EM signal 129. The technique also applies to the case in which more than two modes of the EM energy are selected to provide the multi-mode EM signal. When an EM signal with more than two modes is subjected to mixing, beat signals are generated at all possible frequency differences. Assuming a multi-mode EM signal with m modes in which all of the modes are equally spaced according to the Fabry-Perot (FP) spacing of (c/nL), the signal generated by the mixer will have a component of frequency at $\Delta v^{FP}$ and additional higher harmonics at $2v^{FP}$, $3v^{FP}$, and $(m-1)v^{FP}$. One or more of these frequencies may be detected through the system of FIG. 4, depending on the mode spacing and the frequency response of the receiver at room temperature. Increased sensitivity may be achieved by isolating one or more of the higher harmonics in addition to the fundamental mode difference frequency.

Although the source 100 of the EM energy in the THz range is described with reference to FIG. 1 as a QC laser, the source can be any source that can generate EM energy in the THz range with multiple modes. Additionally, the selected modes of the EM energy must have a frequency difference ($\Delta v$), assuming only two modes, in a range that can be processed using electronic circuits at room temperature. Examples of sources that can be configured to produce an EM signal in the THz range with modes of the required mode spacing include QC lasers, germanium (Ge) lasers, gas lasers, Gunn diodes, backward wave oscillators, Smith-Purcell emitters, Bloch oscillators, and sources that produce an EM signal by difference- and sum-frequency generation. Although these types of sources are given as examples, other sources of an EM signal in the THz range having multiple modes are possible.

Although specific embodiments in accordance with the invention have been described and illustrated, the invention is not limited to the specific forms and arrangements of parts so described and illustrated. The invention is limited only by the claims.

What is claimed is:

1. A method for generating and detecting an electromagnetic (EM) signal in the terahertz (THz) range, the method comprising:
   generating, using a single source, EM energy having multiple modes in the THz range;
   selecting at least two of the modes of the EM energy that is generated using the single source to provide a multi-mode EM signal, adjacent ones of the selected modes of the multi-mode EM signal being separated by a frequency in the radio frequency (RF) frequency range or the microwave frequency range;
   subjecting the at least two modes of the multi-mode EM signal to mixing to generate an output signal in the RF frequency range or the microwave frequency range;
   isolating a beat signal component of the output signal that results from the mixing: and
   measuring the amplitude of the beat signal component.

2. The method of claim 1 wherein the selecting comprises subjecting the EM energy to a partially reflective mirror.

3. The method of claim 1 wherein the selecting comprises filtering the EM energy to isolate the selected modes.

4. The method of claim 1 wherein the selecting comprises dispersing the EM energy as a function of wavelength.

5. The method of claim 1 wherein the single source comprises a resonant cavity.

6. The method of claim 5 wherein the generating comprises configuring the resonant cavity of the single source to produce the multiple modes.

7. The method of claim 1 wherein the selecting comprises configuring a resonant cavity to resonate principally in the selected modes.

8. The method of claim 1 wherein the generating comprises providing a single QC laser; and configuring the roundtrip length of the optical cavity of the QC laser to produce the EM energy having the multiple modes.

9. The method of claim 1 wherein the isolating comprises electronically processing a mixer output signal resulting from the mixing.

10. A system for generating and detecting an electromagnetic (EM) signal in the terahertz (THz) range, the system comprising:
  a single source of multi-mode EM energy in the THz range;
  means for selecting at least two of the modes of the EM energy from the single source to provide a multi-mode EM signal, wherein adjacent ones of the selected modes of the multi-mode EM signal are separated by a frequency in the radio frequency (RF) frequency range or the microwave frequency range;
  a mixer configured to receive the selected modes of the multi-mode EM signal and to generate a mixer output signal in response thereto, the mixer output signal having a frequency in the RF frequency range or the microwave frequency range and including a beat signal component that results from mixing the selected modes of the multi-mode EM signal; and
  signal processing circuitry, in signal communication with the mixer, configured to isolate the beat signal component.

11. The system of claim 10 wherein the means for selecting comprises a mirror having less than one-hundred percent reflectivity.

12. The system of claim 10 wherein the means for selecting comprises a tunable grating configured to reflect the selected modes.

13. The system of claim 10 wherein the means for selecting comprises an etalon configured to pass the selected modes.

14. The system of claim 10, in which the source of the EM energy comprises an active laser medium having facets cut at the Brewster's angles.

15. The system of claim 10, in which the source of the EM energy comprises an active laser medium having facets coated with an antireflective coating.

16. The system of claim 10 wherein the signal processing circuitry comprises one of RF or microwave electronics and wherein the source is configured to generate the modes of the EM energy with frequency differences in a frequency range that can be processed by the signal processing circuitry.

17. A system for generating and detecting an electromagnetic (EM) signal in the terahertz (THz) range, the system comprising:
  a signal generator, comprising;
    a single source configured to generate multi-mode EM energy in the THz range, the EM energy having a frequency difference between adjacent ones of the multiple modes in the radio frequency (RF) frequency range or the microwave frequency range;
    a mode selector configured to select at least two of the modes to provide a multi-mode EM signal; and
  a receiver comprising:
    a mixer in signal communication with the signal generator, the mixer configured to generate a mixer output signal in response to the selected modes of the multi-mode EM signal, the mixer output signal having a frequency in the RF frequency range or the microwave frequency range and including a beat signal component that results from mixing the selected modes of the multi-mode EM signal; and
    signal processing circuitry in signal communication with the mixer, the signal processing circuitry configured to isolate the beat signal component.

18. The system of claim 17 wherein the single source comprises an active laser medium having facets cut at the Brewster's angles.

19. The system of claim 17 wherein the single source comprises an active laser medium having facets coated with an antireflective coating.

* * * * *